(12) United States Patent
Lai

(10) Patent No.: US 11,297,735 B2
(45) Date of Patent: Apr. 5, 2022

(54) HEAT EXCHANGE DEVICE AND LIQUID COOLING SYSTEM HAVING THE SAME

(71) Applicant: IN WIN DEVELOPMENT INC., Taoyuan (TW)

(72) Inventor: Wen-Hsien Lai, New Taipei (TW)

(73) Assignee: IN WIN DEVELOPMENT INC., Taoyuan (TW)

( * ) Notice: Subject to any disclaimer, the term of this patent is extended or adjusted under 35 U.S.C. 154(b) by 333 days.

(21) Appl. No.: 16/728,995

(22) Filed: Dec. 27, 2019

(65) Prior Publication Data
US 2020/0344912 A1 Oct. 29, 2020

(30) Foreign Application Priority Data
Apr. 23, 2019 (CN) .......................... 201910328771.6

(51) Int. Cl.
*F28F 7/00* (2006.01)
*H05K 7/20* (2006.01)

(52) U.S. Cl.
CPC ..... *H05K 7/20272* (2013.01); *H05K 7/20254* (2013.01)

(58) Field of Classification Search
CPC .......... H05K 7/20272; H05K 7/20254; H05K 7/20281
USPC .............................. 165/80.4, 104.28, 104.33
See application file for complete search history.

(56) References Cited

U.S. PATENT DOCUMENTS

| 7,249,625 B2* | 7/2007 | Duan ......................... G06F 1/20 165/104.28 |
| 7,325,591 B2* | 2/2008 | Duan .................... H01L 23/473 165/104.33 |
| 7,509,999 B2* | 3/2009 | Angelis ................... F04D 13/12 165/247 |
| 8,631,860 B2* | 1/2014 | Tang ...................... B65D 51/16 165/278 |

(Continued)

FOREIGN PATENT DOCUMENTS

| CN | 108121424 A | 6/2018 |
| TW | M508885 U | 9/2015 |
| TW | M562420 U | 6/2018 |

OTHER PUBLICATIONS

Search Report appended to an Office Action, which was issued to Taiwanese counterpart application No. 108134355 by the TIPO on Aug. 11, 2020, with an English translation thereof (2 pages).

(Continued)

*Primary Examiner* — Claire E Rojohn, III
(74) *Attorney, Agent, or Firm* — Hamre, Schumann, Mueller & Larson, P.C.

(57) ABSTRACT

A heat exchange device includes a heat exchanger and two pumps. The heat exchanger defines a heat exchange pathway, an inflow pathway communicated with the heat exchange pathway for guiding a cooling liquid to flow into the heat exchange pathway, and an outflow pathway opposite to the inflow pathway for guiding the cooling liquid to flow out from the heat exchange pathway. Each of the pumps includes a case body defining a flow-guiding chamber communicated with and disposed between the heat exchange pathway and the outflow pathway, a rotor mounted in the flow-guiding chamber, and a stator mounted to the case body for driving rotation of the rotor, facilitating flowing movement of the cooling liquid toward the outflow pathway.

9 Claims, 8 Drawing Sheets

(56) References Cited

U.S. PATENT DOCUMENTS

| | | | | |
|---|---|---|---|---|
| 8,988,881 | B2* | 3/2015 | Koplow | F28D 15/0275 |
| | | | | 361/707 |
| 10,058,007 | B2* | 8/2018 | Chiu | H05K 7/20272 |
| 10,299,406 | B2* | 5/2019 | Lin | H05K 7/20327 |
| 10,375,856 | B2* | 8/2019 | Tsai | H01L 23/473 |
| 10,509,446 | B2* | 12/2019 | Tsai | H01L 23/473 |
| 10,593,611 | B2* | 3/2020 | Tsai | H01L 23/467 |
| 10,609,841 | B2* | 3/2020 | Xiao | H01L 23/4735 |
| 10,895,262 | B2* | 1/2021 | Chen | F04D 15/0066 |
| 10,975,876 | B2* | 4/2021 | Lin | F04D 25/0613 |
| 10,976,787 | B2* | 4/2021 | Lin | H05K 7/20154 |
| 2003/0209343 | A1* | 11/2003 | Bingler | F04D 29/582 |
| | | | | 165/80.4 |
| 2004/0042176 | A1* | 3/2004 | Niwatsukino | F28D 15/0266 |
| | | | | 361/699 |
| 2004/0052049 | A1* | 3/2004 | Wu | F28D 15/0266 |
| | | | | 361/699 |
| 2004/0240179 | A1* | 12/2004 | Koga | H01L 23/473 |
| | | | | 361/699 |
| 2005/0243520 | A1* | 11/2005 | Tomioka | F04D 29/5866 |
| | | | | 361/702 |
| 2006/0137856 | A1* | 6/2006 | Popovich | F28F 1/405 |
| | | | | 165/80.4 |
| 2006/0185378 | A1* | 8/2006 | Duan | H05K 7/20263 |
| | | | | 62/259.2 |
| 2008/0087024 | A1* | 4/2008 | Hood | G06F 1/20 |
| | | | | 62/3.2 |
| 2008/0105407 | A1* | 5/2008 | Yeh | H01L 23/467 |
| | | | | 165/104.28 |
| 2009/0044929 | A1* | 2/2009 | Yeh | H01L 23/473 |
| | | | | 165/104.19 |
| 2009/0159244 | A1* | 6/2009 | Mounioloux | F04D 29/586 |
| | | | | 165/104.33 |
| 2009/0218072 | A1* | 9/2009 | Eriksen | G06F 1/206 |
| | | | | 165/80.2 |
| 2011/0100612 | A1* | 5/2011 | Tang | F28D 15/0266 |
| | | | | 165/104.33 |
| 2012/0152498 | A1* | 6/2012 | Lyon | H01L 23/473 |
| | | | | 165/104.31 |
| 2013/0287875 | A1* | 10/2013 | Yoshimi | F04D 13/064 |
| | | | | 425/44 |
| 2014/0008039 | A1* | 1/2014 | Liu | F28F 9/002 |
| | | | | 165/104.13 |
| 2014/0009884 | A1* | 1/2014 | Chen | H01L 23/427 |
| | | | | 361/697 |
| 2014/0069614 | A1* | 3/2014 | Chiu | F28D 15/00 |
| | | | | 165/104.13 |
| 2014/0271123 | A1* | 9/2014 | Rosinski | F04D 13/14 |
| | | | | 415/60 |
| 2016/0234968 | A1* | 8/2016 | Huang | G06F 1/20 |
| 2016/0309618 | A1* | 10/2016 | Tsai | B23P 15/26 |
| 2016/0338223 | A1* | 11/2016 | Tsai | G06F 1/20 |
| 2017/0045306 | A1* | 2/2017 | Tsai | H01L 23/473 |
| 2017/0115708 | A1* | 4/2017 | Tivadar | G06F 1/20 |
| 2017/0235350 | A1* | 8/2017 | Tsai | G06F 1/20 |
| | | | | 165/80.4 |
| 2017/0280592 | A1* | 9/2017 | Lai | G06F 1/20 |
| 2017/0314777 | A1* | 11/2017 | Lai | H05B 47/18 |
| 2017/0331346 | A1* | 11/2017 | Lai | F04D 25/0613 |
| 2017/0359920 | A1* | 12/2017 | Huang | H01L 23/473 |
| 2018/0172365 | A1* | 6/2018 | Tsai | H05K 7/20263 |
| 2018/0308786 | A1* | 10/2018 | Huang | H01L 23/433 |
| 2018/0340550 | A1* | 11/2018 | Lai | F04D 19/002 |
| 2018/0340744 | A1* | 11/2018 | Tsai | H05K 7/20272 |
| 2019/0208665 | A1* | 7/2019 | Tsai | H05K 7/20263 |
| 2019/0239388 | A1* | 8/2019 | Tsai | H05K 7/20263 |
| 2019/0293512 | A1* | 9/2019 | Lai | G01K 1/024 |
| 2020/0042052 | A1* | 2/2020 | Shabbir | H05K 7/20809 |
| 2021/0384811 | A1* | 12/2021 | Rubin | H02K 41/065 |

OTHER PUBLICATIONS

Search Report issued to European counterpart application No. 19219558.4 by the EPO dated Jul. 6, 2020 (7 pages).

\* cited by examiner

HEAT EXCHANGE DEVICE AND LIQUID COOLING SYSTEM HAVING THE SAME

CROSS-REFERENCE TO RELATED APPLICATION

This application claims priority of Chinese Patent Application No. 201910328771.6, filed on Apr. 23, 2019.

FIELD

The disclosure relates to a heat exchange device, and more particularly to a heat exchange device for a liquid cooling system.

BACKGROUND

A conventional liquid cooling system is commonly used for cooling electronic components (such as computing processors) in a computer, and includes a heat absorbing member that is in direct contact with the electronic components, a heat ventilating member, and a driving pump. The heat absorbing member and the heat ventilating member are fluidly communicated with each other via a transfer tube, and a cooling liquid flows thereamong to transfer heat. The cooling liquid initially absorbs generated heat from the electronic components when it flows across the heat absorbing member, and cools down in the heat ventilating member after it flows through the transfer tube into the heat ventilating member. The driving pump has two pumping tubes respectively connected to the heat absorbing member and the heat ventilating member for facilitating cyclic flow of the cooling liquid between the heat absorbing member and the heat ventilating member, so that the electronic components are cooled down in a timely manner. However, the speed in which the driving pump facilitates the cyclic flow of the cooling liquid is relatively slow, thereby leading to less-than-desirable cooling effect.

SUMMARY

Therefore, an object of the disclosure is to provide a heat exchange device that can alleviate the drawback of the prior art.

Another object of the present disclosure is to provide a liquid cooling system having the heat exchange device that can alleviate the drawback of the prior art.

According to one aspect of the disclosure, the heat exchange device has a heat exchanger and two pumps. The heat exchanger defines a heat exchange pathway, an inflow pathway that is fluidly communicated with the heat exchange pathway for guiding a cooling liquid to flow into the heat exchange pathway, and an outflow pathway that is opposite to the inflow pathway for guiding the cooling liquid to flow out from the heat exchange pathway. Each of the pumps includes a case body that defines a flow-guiding chamber fluidly communicated with and disposed between the heat exchange pathway and the outflow pathway, a rotor that is mounted in the flow-guiding chamber, and a stator that is mounted to the case body for driving rotation of the rotor, which facilitates flowing movement of the cooling liquid toward the outflow pathway.

According to another aspect of the disclosure, the liquid cooling system includes the abovementioned heat exchange device, a heat-dissipation device, a heat-dissipation fan, a first guiding tube, and a second guiding tube. The heat-dissipation device is formed with an outflow opening and an inflow opening, and the heat-dissipation fan is mounted to one side of the heat-dissipation device. The first guiding tube has one end connected to the heat-dissipation device to be fluidly communicated with the outflow opening and the other end connected to the heat exchange device to be fluidly communicated with the inflow pathway of the heat exchanger of the heat exchange device. The second guiding tube has one end connected to the heat-dissipation device to be fluidly communicated with the inflow opening, and the other end connected to the heat exchange device to be fluidly communicated with the outflow pathway of the heat exchanger of the heat exchange device.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
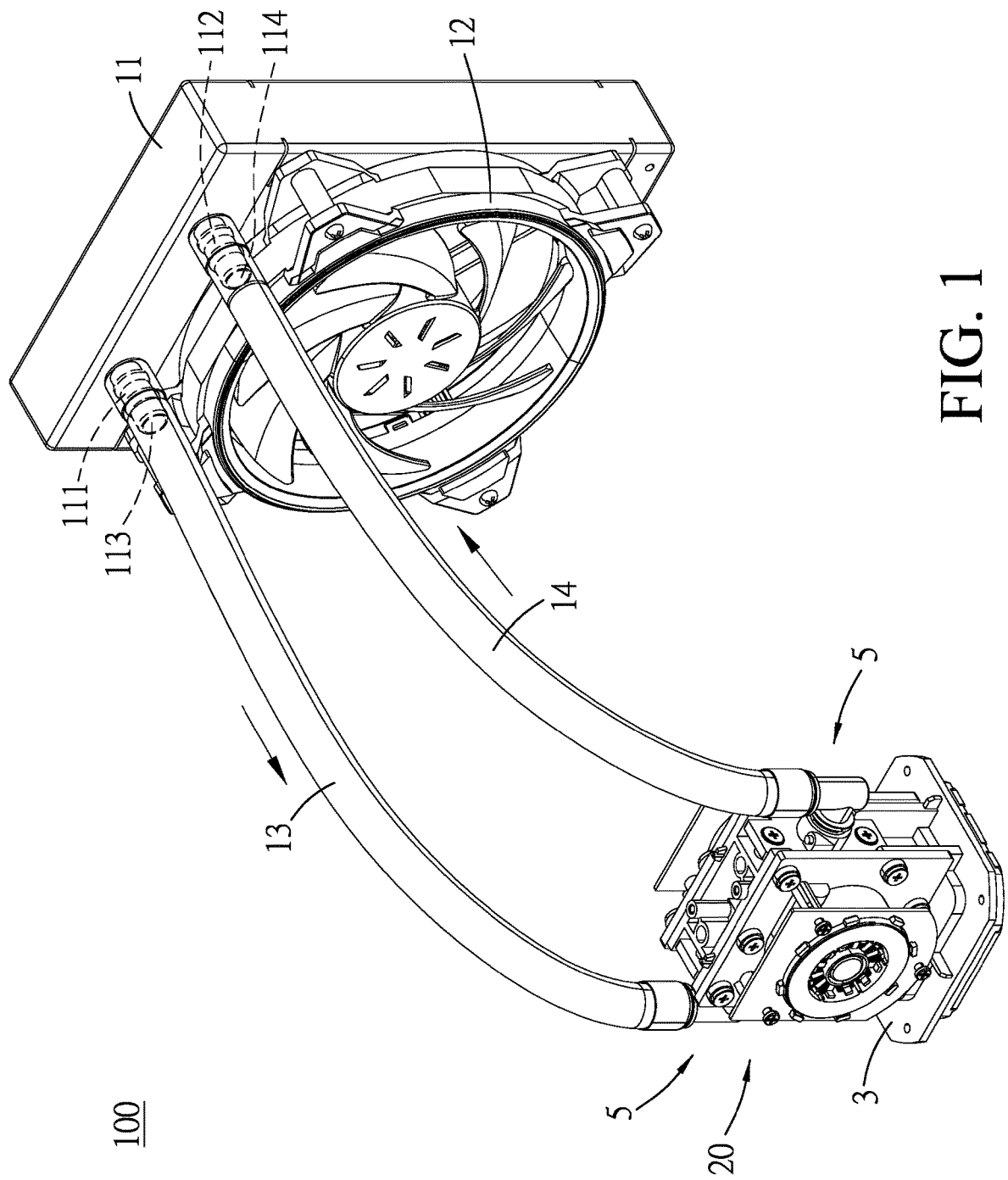
FIG. 1 is a perspective view of an embodiment of a liquid cooling system according to the disclosure having a heat exchange device.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
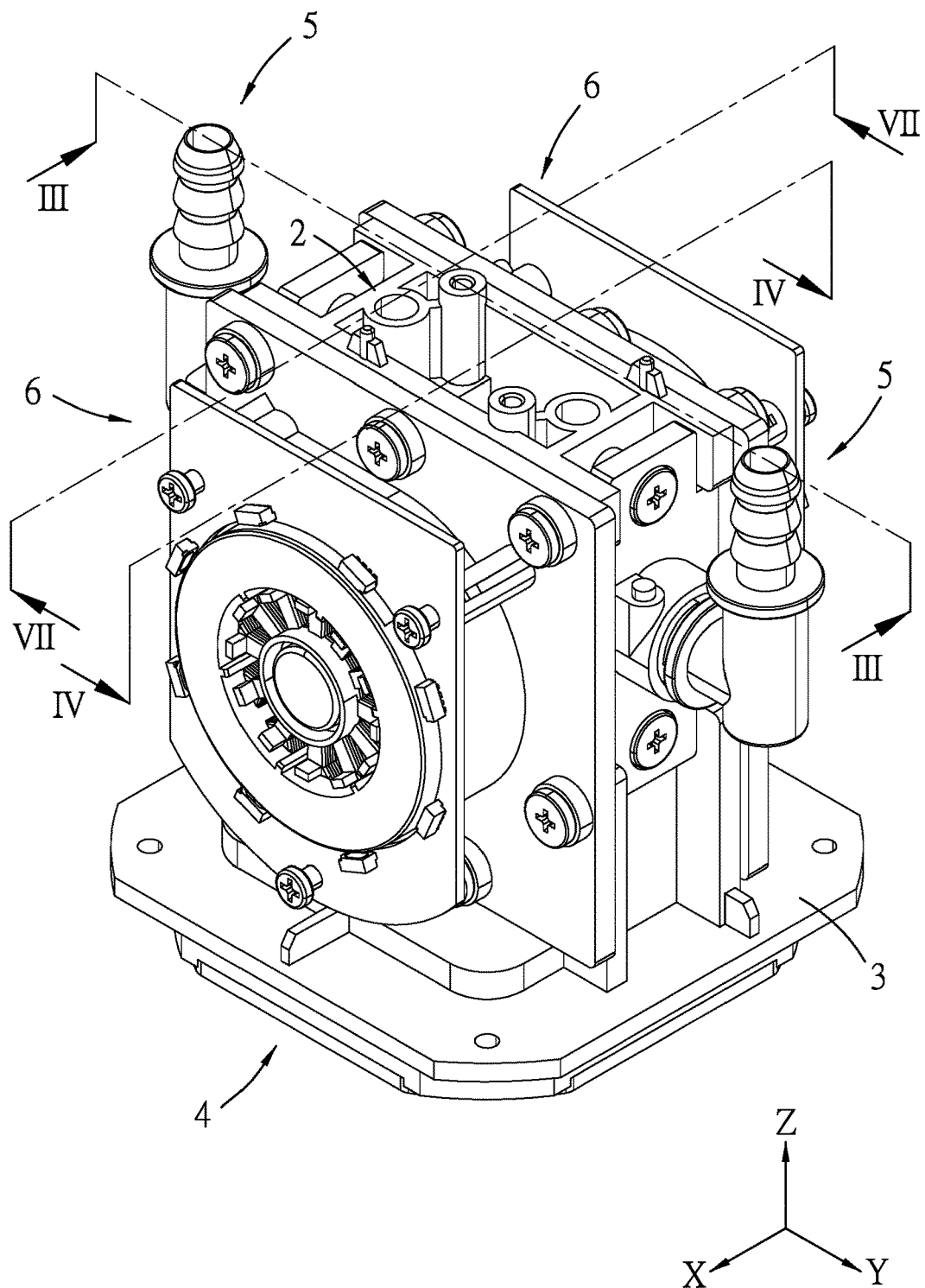
FIG. 2 is a perspective view of the heat exchange device of the embodiment.

Referring to FIG. 1, an embodiment of a liquid cooling system 100 according to the disclosure includes a heat-dissipation device 11, a heat-dissipation fan 12, a first guiding tube 13, a second guiding tube 14 and a heat exchange device 20. Referring to FIG. 2, the heat exchange device 20 includes a heat exchanger 2 and two pumps 6.

Referring back to FIG. 1, the heat-dissipation device 11 includes an outflow connector 111 that is formed with an outflow opening 113, and an inflow connector 112 that is spaced apart from the outflow connector 111 and that is formed with an inflow opening 114. A cooling liquid flows into the heat-dissipation device 11 through the inflow opening 114, and flows out from the heat-dissipation device 11 through the outflow opening 113. The heat-dissipation fan 12 is mounted to one side of the heat-dissipation device 11 for cooling the cooling liquid flowing therethrough. The first guiding tube 13 has one end sleeved on and connected to the outflow connector 111 to be fluidly communicated with the outflow opening 113 and the other end connected to the heat exchanger 2 of the heat exchange device 20 for transferring the cooling liquid from the heat-dissipation device 11 to the heat exchange device 20. The second guiding tube 14 has one end sleeved on and connected to the inflow connector 112 to be fluidly communicated with the inflow opening 114 and the other end connected to the heat exchanger 2 of the heat exchange device 20 for transferring the cooling liquid from the heat exchange device 20 to the heat-dissipation device 11.

Figure 3:
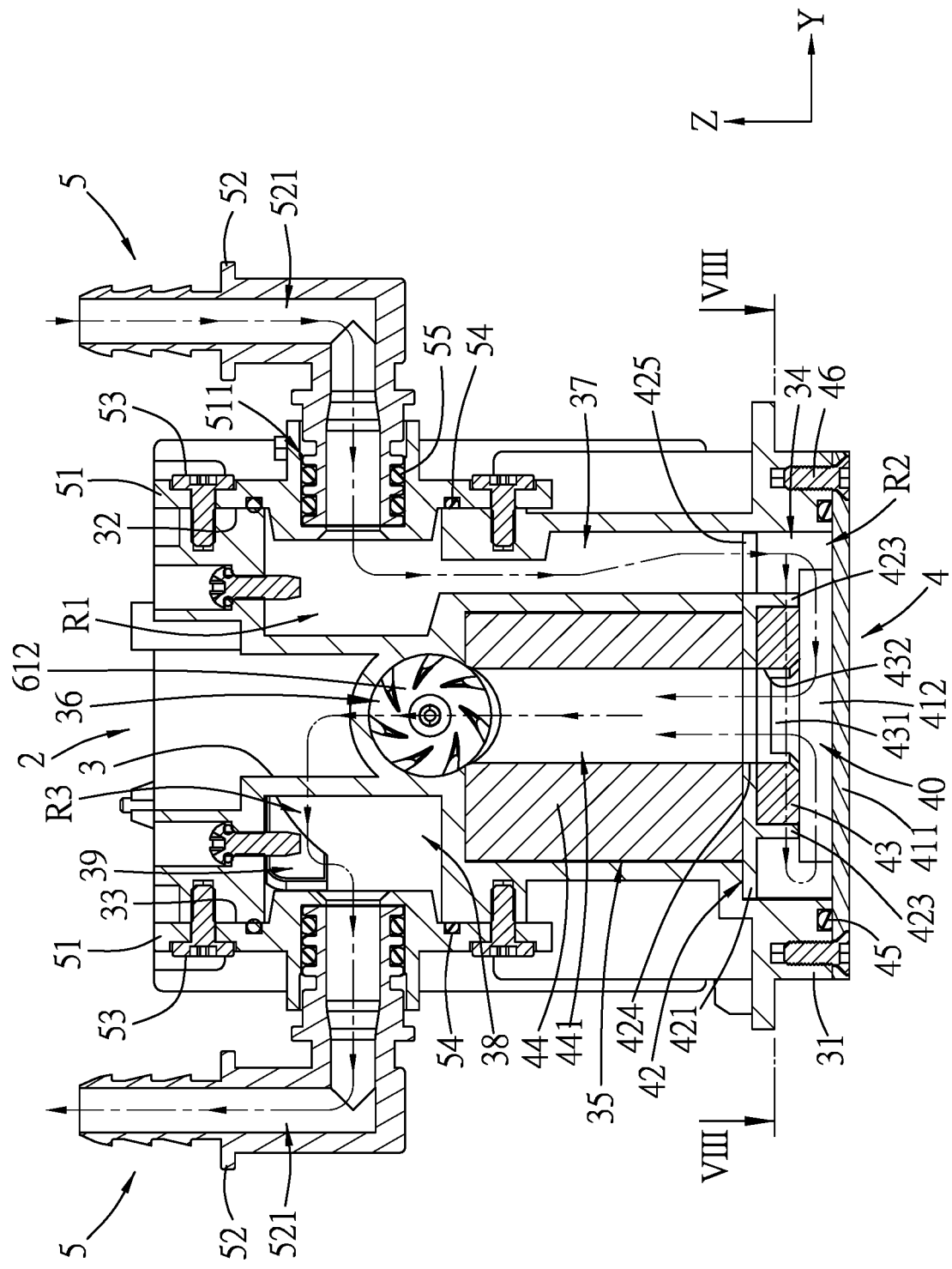
FIG. 3 is a sectional view taken along line III-III of FIG. 2.
Figure 4:
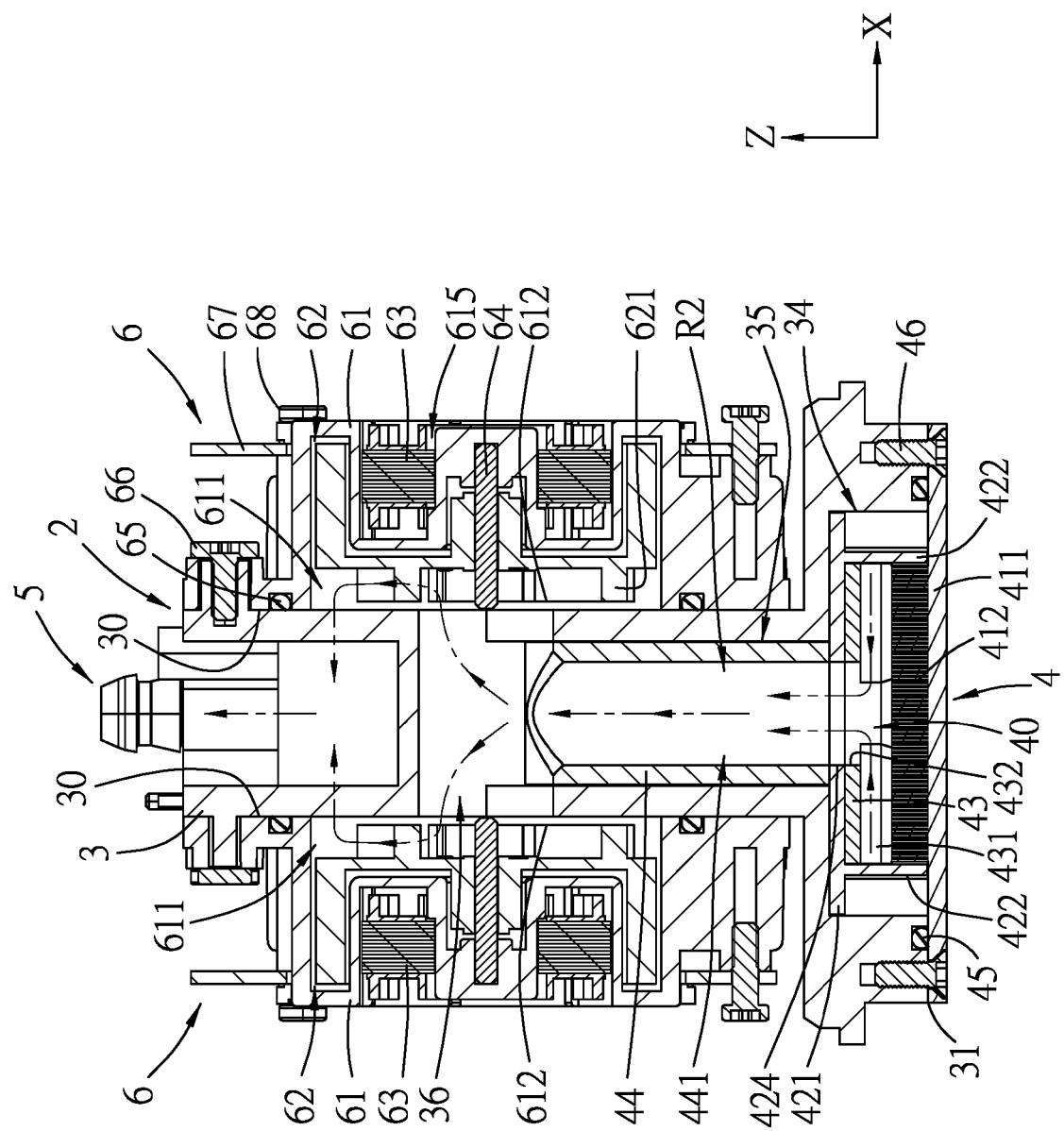
FIG. 4 is a sectional view taken along line IV-IV of FIG. 2.

Referring to FIGS. 2 to 4, the heat exchanger 2 is in direct contact with an electronic component (such as a processing unit) so as to absorb heat generated therefrom. The heat exchanger 2 defines an inflow pathway (R1), a heat exchange pathway (R2), and an outflow pathway (R3). The inflow pathway (R1) is fluidly communicated with the first guiding tube 13 on one end and with the heat exchange pathway (R2) on the other end for the cooling liquid to flow into the heat exchange pathway (R2). The cooling liquid undergoes heat exchange with the heat exchanger 2 when it flows through the heat exchange pathway (R2) to absorb the heat the heat exchanger 2 has stored. The outflow pathway (R3) is opposite to the inflow pathway (R1), is fluidly communicated with the second guiding tube 14 on one end and with the heat exchange pathway (R2) on the other end for the cooling liquid to flow out from the heat exchange pathway (R2) into the second guiding tube 14.

Each of the pumps 6 includes a case body 61, a rotor 62 and a stator 63. The case bodies 61 of the pumps 6 are respectively mounted to two opposite ends of the heat exchanger 2. The case body 61 of each of the pumps 6 defines a flow-guiding chamber 611 that is fluidly communicated with and disposed between the heat exchange pathway (R2) and the outflow pathway (R3). The rotor 62 is mounted in the flow-guiding chamber 611. The stator 63 is made of a silicon steel plate set surrounded by coils, and is mounted to the case body 61 for driving rotation of the rotor 62, facilitating flowing movement of the cooling liquid toward the outflow pathway (R3). As such, the cooling liquid is permitted to flow out from the outflow pathway (R3) to the second guiding tube 14, and then flow from the second guiding tube 14 to the heat exchanger 11 for cooling. The heat exchange device 20, by utilizing driving force generated by the rotation of the rotors 62 of the two pumps 6, drives the flowing motion of the cooling liquid and increases the flow speed in which the cooling liquid flows cyclically through the inflow pathway (R1), the heat exchange pathway (R2), the flow-guiding chambers 611, and the outflow pathway (R3), effectively improving the heat-dissipating effect on the electronic component. In addition, as the case bodies 61 of the pumps 6 are respectively mounted to two opposite ends of the heat exchanger 2, the flow-guiding chambers 611 of the pumps 6 are not directly communicated with each other. As a result, direction and speed of the flow of the cooling liquid driven by the rotors 62 in the respective flow-guiding chambers 611 would not interfere with each other, thereby allowing the cooling liquid to smoothly flow through the flow-guiding chambers 611.

Figure 5:
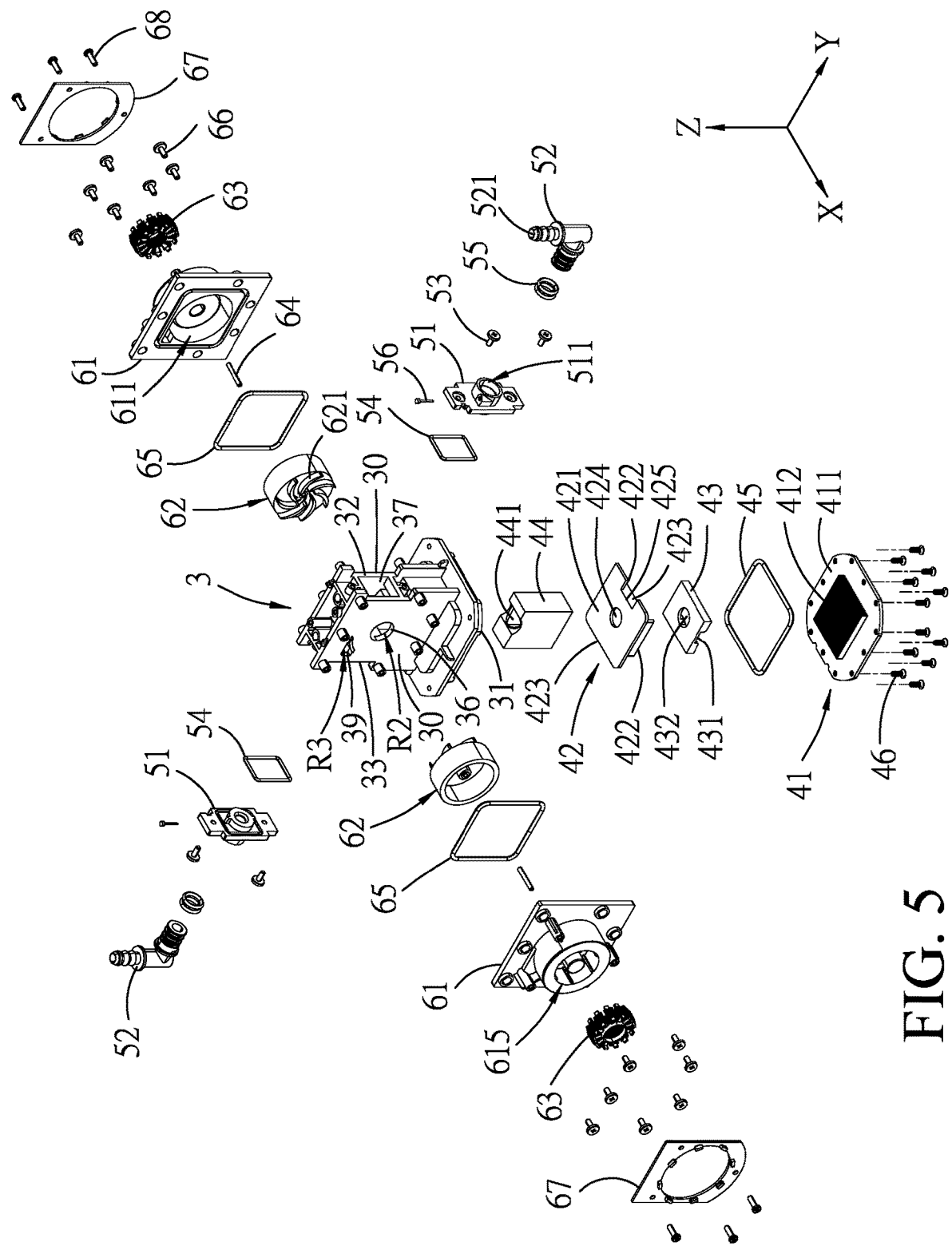
FIG. 5 is an exploded perspective view of the heat exchange device of the embodiment.
Figure 6:
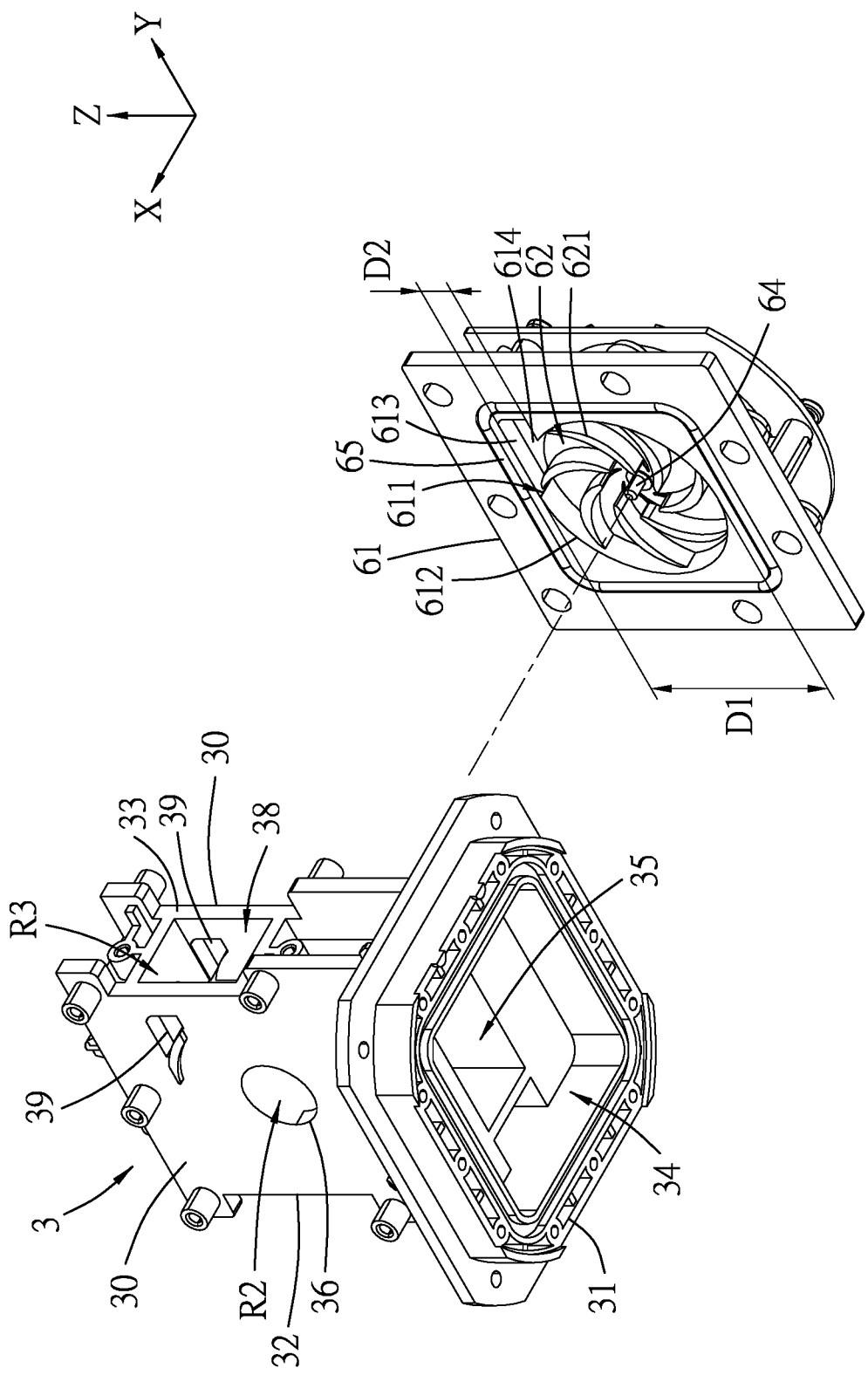
FIG. 6 is a partly exploded perspective view of the heat exchange device of the embodiment, illustrating an assembling relationship between a base frame of a heat exchanger of the heat exchange device and one of two pumps.

Referring to FIGS. 4 to 6, the heat exchanger 2 includes a base frame 3 that has two spaced-apart end surfaces 30. A portion of the heat exchange pathway (R2) and a portion of the outflow pathway (R3) are formed between the end surfaces 30 and are not directly and fluidly communicated with each other. The case bodies 61 of the pumps 6 respectively abut against the end surfaces 30. The flow-guiding chamber 611 of each of the case bodies 61 faces a respective one of the end surfaces 30, and has a housing portion 612 that is for housing the rotor 62 and that is fluidly communicated with the heat exchange pathway (R2), and a draining portion 613 that is fluidly communicated with one end of the housing portion 612 and the outflow pathway (R3). When the rotors 62 of the pumps 6 rotate, pressure difference is built between the heat exchange pathway (R2) and the flow-guiding chambers 611, such that the housing portions 612 of the flow-guiding chambers 611 would be able to build enough suction to pull the cooling liquid thereinto from the heat exchange pathway (R2). In the embodiment, as the housing portions 612 are disposed above the heat exchange pathway (R2), the cooling liquid is essentially pulled upwardly against the force of gravity. Afterward, the cooling liquid exits the flow-guiding chambers 611 through the draining portions 613 to be directed to the outflow pathway (R3).

In addition, the housing portion 612 of the flow-guiding chamber 611 is a circular groove in this embodiment and has an inner diameter (D1), and the draining portion 613 of the flow-guiding chamber 611 has a through opening 614 that is fluidly communicated with the housing portion 612 and that has a width (D2) smaller than the inner diameter (D1). After the cooling liquid flows through the through opening 614 into the draining portion 613, the flow speed would become faster as a result of transitioning from the housing portion 612 with the inner diameter (D1) to the draining portion 613 with the width (D2), increasing the rate in which the cooling liquid flows from the draining portions 613 of the flow-guiding chambers 611 to the outflow pathway (R3), and sequentially to the second guiding tube 14.

Each of the pumps 6 further includes a shaft 64, an annular sealing member 65, a plurality of first screws 66, a control circuit board 67, and a plurality of second screws 68 for mounting the control circuit board 67 to case body 61. For the sake of brevity, only elements of one of the pumps 6 will be elaborated in the following paragraphs. The shaft 64 extends through the case body 61 and is partially disposed in the flow-guiding chamber 611. The rotor 62 is rotatably connected to the shaft 64 and has an impeller portion 621.

The sealing member 65 is mounted between the case body 61 and a corresponding one of the end surfaces 30, and surrounds the flow-guiding chamber 611, so as to fluid-tightly seal a space (i.e., the flow-guiding chamber 611) between the heat exchange pathway (R2) and the outflow pathway (R3). The sealing member 65 ensures that the cooling liquid does not leak out of gaps formed between the case body 61 and the corresponding one of the end surfaces 30 when it flows through the heat exchange pathway (R2) and the outflow pathway (R3). The sealing effect of the sealing member 65 is further improved by the inclusion of the first screws 66, which removably secure the case body 61 to the corresponding one of the end surfaces 30 of the base frame 3, such that the sealing member 65 is securely clamped therebetween and becomes deformed to fill any remaining gaps. When the heat exchange device 20 has been used for a period of time, a user may easily unfasten the first screws 66 to separate the case body 61 from the base frame 3 for cleaning the interior of the flow-guiding chamber 611 or the rotor 62. In other embodiment, the first screws 66 may be replaced with other types of fasteners.

The case body 61 of each of the pumps 6 further defines an outer chamber 615 distal from the end surfaces 30. The stator 63 is mounted in the outer chamber 615 and is surrounded by the rotor 62. The electric circuit board 67 is electrically connected to the stator 63 for generating magnetic field, thereby driving rotation of the rotor 62.

Referring back to FIGS. 3 to 5, the base frame 3 further has a bottom surface 31, a first side surface 32, and a second side surface 33 opposite to the first side surface 32. The heat exchange device 2 further includes a heat exchange set 4 and two side connector sets 5. The heat exchange set 4 is removably mounted to the bottom surface 31, and cooperates with the base frame 3 to define the heat exchange pathway (R2). One of the side connector sets 5 is removably mounted to the first side surface 32 and cooperates with the base frame 3 to define the inflow pathway (R1), and the other side connector set 5 is removably mounted to the second side surface 33 and cooperates with the base frame 3 to define the outflow pathway (R3). Similar to the case bodies 61 of the pumps 6, when the heat exchange device 20 has been used for a period of time, the user may uncouple the heat exchange set 4 and the side connector sets 5 for cleaning the interior thereof.

In this embodiment, the end surfaces 30 of the base frame 3 are spaced apart in a first direction (X), and the first and second surfaces 32, 33 are spaced apart in a second direction (Y) orthogonal to the first direction (X) so that the pumps 6 and the side connector sets 5 have enough space to be mounted around an outer surface of the base frame 3. As such, the side connector sets 5 and the pumps 6 are able to be arranged within a relatively small range in a third direction (Z), which is orthogonal to the first and the second directions (X,Y), to thereby miniaturize the heat exchange device 20. In the embodiment, the first direction (X) is front-rear direction, the second direction (Y) is lateral direction, and the third direction (Z) is vertical direction.

Referring back to FIGS. 3 to 5, the base frame 3 is formed with a bottom groove 34 indenting upwardly from the bottom surface 31, an upper groove 35 extending from and communicated with a top end of the bottom groove 34, and a flow-splitting hole 36 communicated with a top end of the upper groove 35 and extending through the end surfaces 30. Specifically, the flow-splitting hole 36 is fluidly communicated with and disposed between the housing portions 612 of the flow-guiding chambers 611 of the two pumps 6.

Figure 7:
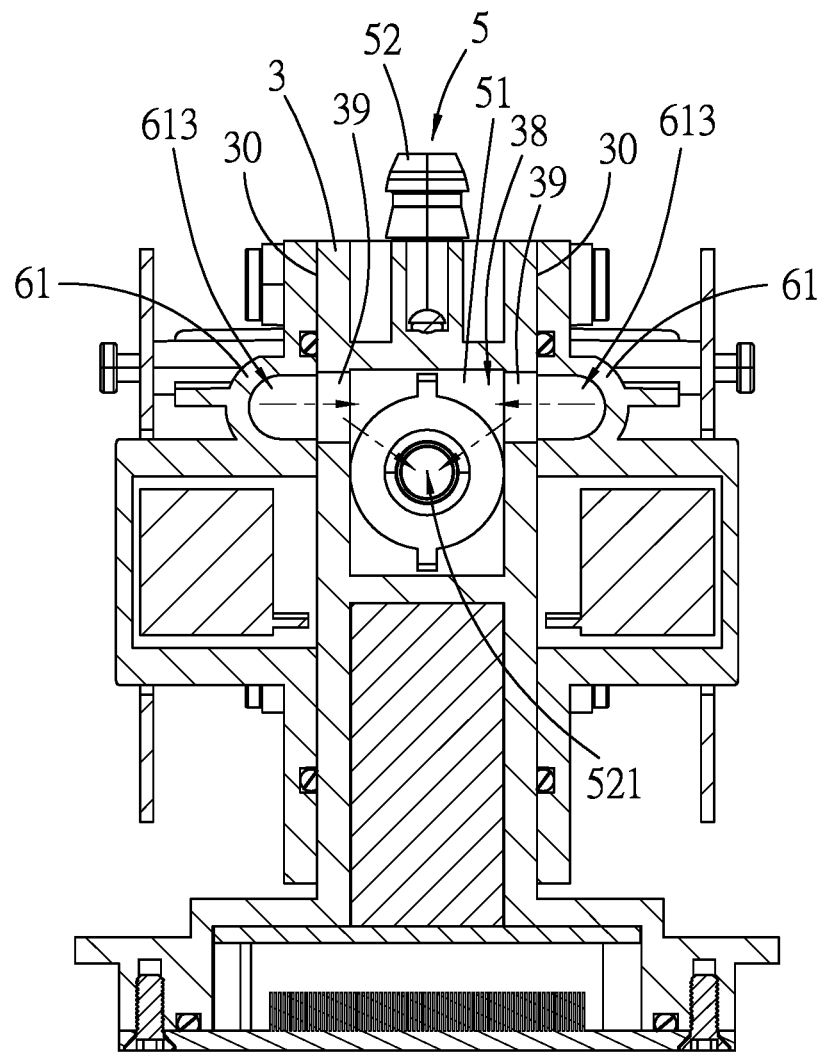
FIG. 7 is a sectional view taken along line VII-VII in FIG. 2.

Referring to FIGS. 5 to 7, the base frame 3 is further formed with a first side chamber 37 that indents inwardly from the first side surface 32 and that is communicated with the heat exchange pathway (R2), a second side chamber 38 that indents inwardly from the second side surface 33, and two flow-joining holes 39 (only one is shown in FIG. 5) that indent respectively and inwardly from the end surfaces 30, that are communicated with the second side chamber 38, and that are respectively communicated with the draining portions 613 of the flow-guiding chambers 611 of the case bodies 61.

Referring back to FIGS. 3 to 5 and 8, the heat exchange set 4 has a heat-conducting plate 41, a positioning frame 42, a flow-joining block 43, a flow-guiding block 44, an annular sealing member 45, and a plurality of fastening members 46. The heat-conducting plate 41 is partly disposed in the bottom groove 34 and is removably mounted to the bottom surface 31 via the fastening members 46. The positioning frame 42 is engaged to the bottom groove 34 and abuts against the heat-conducting plate 41. The flow-joining block 43 is engaged to the positioning frame 42 and is disposed on a top end of the heat-conducting plate 41. The base frame 3, the heat-conducting plate 41, the positioning frame 42 and the flow-joining block 43 cooperatively define a heat exchange chamber 40.

Specifically, the heat-conducting plate 41 includes a plate body 411 that is removably mounted to the bottom surface 31 via the fastening members 46 such as screws, and a plurality of heat-dissipating fins 412 that are mounted to a top end of the plate body 411 and that are disposed in the bottom groove 34. A bottom end of the plate body 411 abuts against the electronic component, and the heat-dissipating fins 412 are spaced apart from each other in the first direction (X). The positioning frame 42 includes a top plate 421, two first vertical plates 422 that protrude from a bottom end of the top plate 421 and that are spaced apart from each other in the first direction (X), and two second vertical plates 423 that protrude from the bottom end of the top plate 421 and that are spaced apart from each other in the second direction (Y). The top plate 421 is engaged in the bottom groove 34 and is formed with a through hole 424 that is disposed below the upper groove 35. A side of the top plate 421 is indented for forming an opening 425 that is communicated with a bottom end of the first side chamber 37. The first vertical plates 422 are respectively disposed in front and rear sides of the heat-dissipating fins 412 and abut against the top end of the plate body 411 of the heat-conducting plate 41, and the second vertical plates 423 abut against top ends of the heat-dissipating fins 412 of the heat-conducting plate 41. The flow-joining block 43 is engaged among the top plate 421 and the first and second vertical plates 422, 423, a bottom end thereof is indented for forming a flow-joining groove 431, and a top end thereof is indented for forming a flow-joining hole 432. The flow-joining groove 431 extends in the first direction (X) and is communicated with top ends of gaps formed between adjacent ones of the heat-dissipating fins 412. The flow-joining hole 432 is communicated with the flow-joining groove 431 and a bottom end of the through hole 424 of the positioning frame 42, and is disposed at a center of the flow-joining groove 431. Overall, the through hole 424 and the opening 425 of the positioning frame 42, the bottom groove 34, the gaps formed between the adjacent ones of the heat-dissipating fins 412, the flow-joining groove 431 and the flow-joining hole 432 cooperatively define the heat exchange chamber 40.

The flow-guiding block 44 is engaged to the upper groove 35 and is formed with a flow-guiding hole 441 that extends in the third direction (Z) and that is communicated with the heat exchange chamber 40 and the flow-splitting hole 36. The heat exchange chamber 40, the flow-guiding hole 441, and the flow-splitting hole 36 cooperatively formed the heat-exchange pathway (R2). The sealing member 45 is mounted between the top end of the plate body 411 and the bottom surface 31 of the base frame 3, and surrounds the heat exchange chamber 40. The sealing member 45 is deformed by and securely clamped between the base frame 3 and the plate body 411 for ensuring that the cooling liquid does not leak out of gaps formed between the bottom surface 31 and the plate body 411 when it flows through the heat exchange chamber 40.

Referring back to FIGS. 3 to 5, the two side connector sets 5 are structurally identical. Each of the side connector sets 5 includes a side cover 51, a L-shaped connector 52 that is mounted to the side cover 51 and that defines a through hole 521 therethrough, and a plurality of first screws 53. The side cover 51 is removably mounted to a respective one of the first and second side surfaces 32, 33 via the first screws 53. In the embodiment, the side cover 51 is formed with an insertion hole 511 for the connector 52 to be mounted thereto on one end, and the connector 52 is sleeved by a respective one of the first and second guiding tubes 13, 14 (only shown in FIG. 1) on the other end. The through hole 521 of one of the side connector sets 5 is communicated with the first side chamber 37 to cooperatively define the inflow pathway (R1), and the through hole 521 of the other one of the side connector sets 5 is communicated with the second side chamber 38 and the two flow-joining holes 39 of the base frame 3 to cooperatively define the outflow pathway (R3).

Each of the side connector sets 5 further includes an annular first sealing member 54, a plurality of annular second sealing members 55, and a second screw 56. Each of the first sealing member 54 is mounted between the side cover 51 and a respective one of the first and second side surfaces 32 of the base frame 3, and surrounds a respective one of the first and second side chambers 37, 38. The sealing member 54 of each of the side connector sets 5 is deformed by and securely clamped between the respective one of the first and second side surfaces 32, 33 and the side cover 51 for ensuring that the cooling liquid does not leak out of gaps formed therebetween when it flows through the respective one of the first and second side chambers 37, 38. For each of the side connector sets 5, the second sealing members 55 sleeve the connector 52 and is securely clamped between the side cover 51 and the connector 52 for ensuring that the cooling liquid does not leak out of gaps formed therebetween.

Referring back to FIGS. 1, 3 and 4, during the operation of the liquid cooling system 100, the control circuit boards 67 of the pumps 6 initiate rotation of the rotors 62 in the same direction, which builds pressure difference between the heat exchange pathway (R2) and the flow-guiding chambers 611, such that pressure difference is also built among the inflow pathway (R1), the first guiding tube 13 and the heat-dissipation device 11. The pressure difference allows the cooling liquid in the heat-dissipation device 11 to flow through the first guiding tube 13 into the through hole 521 of the inflow pathway (R1) into the first side chamber 37. Then, the cooling liquid flows downwardly from the first side chamber 37, through the opening 425 of the positioning frame 42 into the heat exchange chamber 40.

Figure 8:
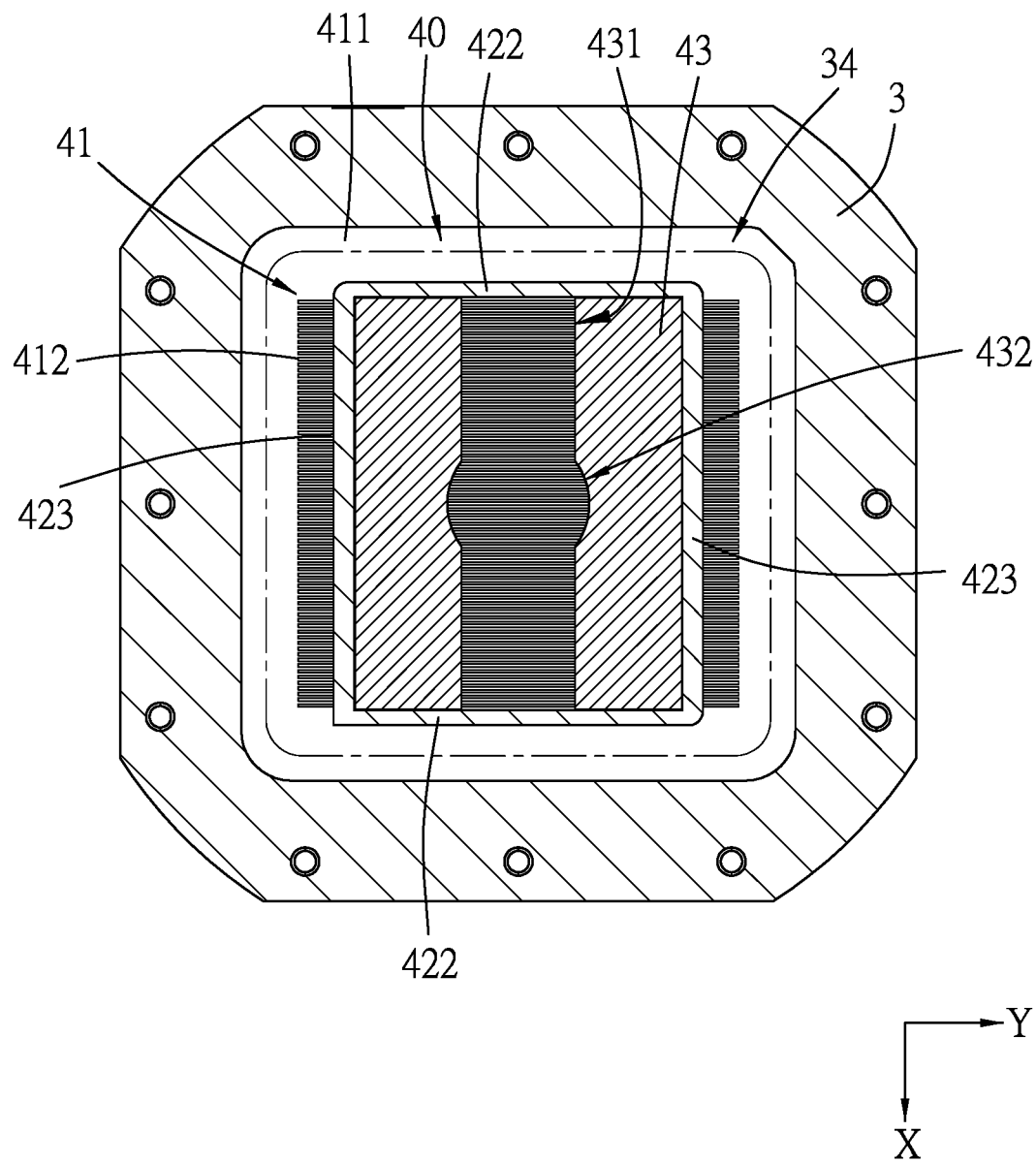
FIG. 8 is a sectional view taken along line VIII-VIII in FIG. 3.

Referring to FIGS. 3, 4 and 8, when the cooling liquid flows into the heat exchange chamber 40 from the opening 425, a portion thereof flows directly into the gaps formed between the adjacent ones of the heat-dissipating fins 412, while the other portion thereof flows between the heat-dissipating fins 412 and the base frame 3 before entering the abovementioned gaps. When the heat-dissipating fins 412 conduct heat from the plate body 411, the cooling liquid undergoes heat exchange therewith to flow upwardly into the flow-splitting hole 36 via the flow-joining groove 431, the flow-joining hole 432, the through hole 424 of the positioning frame 42, and the flow-guiding hole 441.

Referring back to FIGS. 1, 3, 4 and 7, the cooling liquid in the flow-splitting hole 36 is split into two flows that respectfully flow into the housing portions 612 of the flow-guiding chambers 611. Within each of the flow-guiding chambers 611, the one flow of the cooling liquid is driven by the impeller 621 of the rotor 62 to flow into the draining portion 613 from the through opening 614 thereof, and then out from the draining portion 613 into the flow-joining holes 39 to rejoin the other flow of the cooling liquid. After rejoining, the cooling liquid would flow through the through hole 521 of the outflow pathway (R3) into the second guiding tube 14. As the width (D2) of the through opening 614 of the draining portion 613 is smaller than the inner diameter (D1) of the housing portion 612, the flow speed becomes faster, increasing the rate in which the cooling liquid flows from the draining portions 613 of the flow-guiding chambers 611 to the outflow pathway (R3), and sequentially to the second guiding tube 14. Afterward, the cooling liquid flows into the heat-dissipation device 11 from the second guiding tube 14 to be cooled by the heat-dissipation fan 12, so that the cooling liquid is cooled down for cyclic use.

Overall, the liquid cooling system 100 of the embodiment takes advantages of the synchronous rotation of the rotors 62 of the two pumps 6 of the heat exchange device 20 to increase the flow rate of the cooling liquid along the inflow pathway (R1), the heat exchange pathway (R2), the flow-guiding chambers 611 and the outflow pathway (R3), thereby improving the heat-dissipating functionality of the embodiment.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A heat exchange device comprising:
  a heat exchanger that defines a heat exchange pathway, an inflow pathway fluidly communicated with said heat exchange pathway for guiding a cooling liquid to flow into said heat exchange pathway, and an outflow pathway opposite to said inflow pathway for guiding the cooling liquid to flow out from said heat exchange pathway; and
  two pumps each of which includes
    a case body defining a flow-guiding chamber fluidly communicated with and disposed between said heat exchange pathway and said outflow pathway,
    a rotor mounted in said flow-guiding chamber, and
    a stator mounted to said case body for driving rotation of said rotor, which facilitates flowing movement of the cooling liquid toward said outflow pathway;
  wherein, said case bodies of said pumps are respectively mounted to two opposite faces of said heat exchanger.

2. The heat exchange device as claimed in claim 1, wherein:
  said heat exchanger includes two spaced-apart end surfaces;
  a portion of said heat exchange pathway and a portion of said outflow pathway are formed between said end surfaces and are not directly communicated fluidly with each other;
  said case bodies of said pumps respectively abut against said end surfaces; and said flow-guiding chamber of each of said case bodies faces a corresponding one of said end surfaces, and has a housing portion that is for housing said rotor and that is fluidly communicated with said heat exchange pathway, and a draining portion that is fluidly communicated with one end of said housing portion and said outflow pathway.

3. The heat exchange device as claimed in claim 2, wherein:
said housing portion of said flow-guiding chamber has an inner diameter; and
said draining portion of said flow-guiding chamber has a through opening that is fluidly communicated with said housing portion and that has a width smaller than said inner diameter.

4. The heat exchange device as claimed in claim 1, wherein:
said heat exchanger includes two spaced-apart end surfaces;
said case bodies of said pumps respectively abut against said end surfaces; and
each of said pumps further includes a plurality of screws for removably securing said case body to said end surfaces of said heat exchanger.

5. The heat exchange device as claimed in claim 1, wherein:
said heat exchanger includes
a base frame that has a bottom surface, a first side surface, a second side surface opposite to said first side surface, and two spaced-apart end surfaces,
a heat exchange set that is removably mounted to said bottom surface and that cooperates with said base frame to define said heat exchange pathway, and
two side connector sets one of which is removably mounted to said first side surface and cooperates with said base frame to define said inflow pathway, and the other one of which is removably mounted to said second side surface and cooperates with said base frame to define said outflow pathway;
said case bodies of said pumps are respectively and removably mounted to said end surfaces.

6. The heat exchange device as claimed in claim 5, wherein said end surfaces are spaced apart in a first direction (X), and said first and second side surfaces are spaced apart in a second direction (Y) orthogonal to the first direction (X).

7. The heat exchange device as claimed in claim 1, wherein:
said heat exchanger includes
a base frame that has a bottom surface and two spaced-apart end surfaces, and that is formed with a bottom groove indenting upwardly from said bottom surface, an upper groove extending from and communicated with a top end of said bottom groove, and a flow-splitting hole communicated with a top end of said upper groove and extending through said end surfaces, and
a heat exchange set that has
a heat-conducting plate partly disposed in said bottom groove and removably mounted to said bottom surface via a plurality of fastening members,
a positioning frame engaged to said bottom groove and abutting against said heat-conducting plate,
a flow-joining block engaged to said positioning frame and disposed on a top end of said heat-conducting plate, and
a flow-guiding block;
said flow-guiding chamber of each of said case bodies faces a respective one of said end surfaces and is fluidly communicated with said flow-splitting hole;
said base frame, said heat-conducting plate, said positioning frame and said flow-joining block cooperatively define a heat exchange chamber;
said flow-guiding block is engaged to said upper groove and is formed with a flow-guiding hole that is communicated with said heat exchange chamber and said flow-splitting hole; and
said heat exchange chamber, said flow-guiding hole, and said flow-splitting hole cooperatively form said heat-exchange pathway.

8. The heat exchange device as claimed in claim 1, wherein:
said heat exchanger includes
a base frame that has a first side surface, a second side surface opposite to said first side surface, and two spaced-apart end surfaces, and
two side connector sets, each of which includes a side cover and a connector mounted to said side cover and defining a through hole;
said base frame is formed with
a first side chamber that indents inwardly from said first side surface and that is communicated with said heat exchange pathway,
a second side chamber that indents inwardly from said second side surface, and
two flow-joining holes that indent respectively and inwardly from said end surfaces, that are communicated with said second side chamber, and that are respectively communicated with said flow-guiding chambers of said case bodies;
said flow-guiding chamber of each of said case bodies faces a respective one of said end surfaces;
said side covers of said side connector sets are respectively and removably mounted to said first and second side surfaces via screws;
said through hole of one of said side connector sets is communicated with said first side chamber to cooperatively define said inflow pathway, and said through hole of the other one of said side connector sets is communicated with said second side chamber to cooperatively define said outflow pathway.

9. A liquid cooling system comprising:
the heat exchange device as claimed in claim 1;
a heat-dissipation device that is formed with an outflow opening and an inflow opening;
a heat-dissipation fan that is mounted to one side of said heat-dissipation device;
a first guiding tube that has one end connected to said heat-dissipation device to be fluidly communicated with said outflow opening and the other end connected to the heat exchange device to be fluidly communicated with the inflow pathway of the heat exchanger of the heat exchange device; and
a second guiding tube that has one end connected to said heat-dissipation device to be fluidly communicated with said inflow opening, and the other end connected to the heat exchange device to be fluidly communicated with the outflow pathway of the heat exchanger of the heat exchange device.

* * * * *